United States Patent [19]

Yagi

[11] Patent Number: 4,691,855
[45] Date of Patent: Sep. 8, 1987

[54] TWIN WIRE SPLITTER SYSTEM

[75] Inventor: Harumi Yagi, Yokohama, Japan

[73] Assignee: Fujitsu Limited, Kawasaki, Japan

[21] Appl. No.: 814,257

[22] Filed: Dec. 30, 1985

[51] Int. Cl.[4] .......................................... H05K 13/06
[52] U.S. Cl. .................................... 228/4.5; 228/5.1; 29/755; 29/850
[58] Field of Search ........................ 228/4.5, 5.1, 179; 29/850, 755

[56] References Cited

U.S. PATENT DOCUMENTS 4,000,558 1/1977 Cahill .................................... 29/850

FOREIGN PATENT DOCUMENTS 128270 10/1979 Japan .................................... 228/4.5

Primary Examiner—Kenneth J. Ramsey
Attorney, Agent, or Firm—Staas & Halsey

[57] ABSTRACT

A twin wire splitter system comprises an X-Y table for mounting a printed circuit board thereon; a wire bonding device for continuously bonding a twin wire to a plurality of wire connecting positions on the printed circuit board; a feeding device for feeding the twin wire; a splitting device provided on a twin wire feeding path to split the twin wire; and a splitting operation controlling device for controlling the start and end of the twin wire splitting operation carried out by the splitting means, according to the length along the twin wire feeding path between the bonding position of the wire bonding device and the splitting position of the splitting device, the length of a portion of the twin wire to be split, and the feed length of the twin wire for each sucessive bonding operation corresponding to the connecting sequence of positions to be interconnected by the twin wire on the printed circuit board.

5 Claims, 6 Drawing Figures

TWIN WIRE SPLITTER SYSTEM

BACKGROUND OF THE INVENTION

1. Field of the Invention

The present invention relates to a splitter system for splitting a twin wire used for connecting together pads on a printed circuit board.

2. Description of the Related Art

When a large number of semiconductor electronic elements such as LSI's are mounted on a printed circuit board, sometimes the pattern formed on the printed circuit board is insufficient to enable connection of all of the terminals, due to the excessive number of terminals to be connected. In such a case, or in the event of a design change, wire connection between terminals is carried out on the rear side of the printed circuit board. For this purpose, a twin wire comprising two wires connected together in parallel is used. The twin wire is split into two wires in the vicinity of a wire connecting position and bonded to two adjacent pads, respectively. To supply the twin wire continuously to a wire bonder, the twin wire must be split, at an interval corresponding to a distance between two wire connecting positions, for a length necessary to allow the wires to be bonded to two pads at each wire connecting position.

In a conventional twin wire splitter unit combined with a wire bonder, one end of a twin wire is bonded to a printed circuit board at a bonding tip position. The printed circuit board is then moved with the twin wire being drawn to set the next wire connecting position under the bonding tip. During this movement of the printed circuit board with the twin wire, a splitting means such as a pin is thrust into the center of the twin wire to split the twin wire for a predetermined length. Namely, when the twin wire is fed to the next connecting position, to perform the next bonding operation after completion of the bonding at the previous position, the splitting pin is driven to split the twin wire for a predetermined length. In such a conventional splitter unit, the feed length of the twin wire must be longer than the length of a twin wire feeding path between the bonding position (a position where the bonding tip is located) and the splitting position (a position where the splitting pin is located) to enable the twin wire to be split by the pin at the splitting position. Namely, if the distance between two wire connecting positions on the printed circuit board is short, i.e., the length of twin wire necessary for connection becomes shorter than the length between the bonding and splitting positions, then it is impossible to split the twin wire at the position corresponding to the next bonding position during the feed motion of the twin wire, after a leading end of the wire is bonded.

SUMMARY OF THE INVENTION

In order to overcome the above-mentioned drawbacks of the prior art, an object of the present invention is to provide a twin wire splitter system which is able to continuously and automatically split a twin wire for a predetermined split length with respect to any required feed length of twin wire, irrespective of a distance between wire connecting positions.

To accomplish the above object, the present invention provides a twin wire splitter system comprising an X-Y table for mounting a printed circuit board thereon; a wire bonding means for continuously bonding a twin wire to a plurality of wire connecting positions on the printed circuit board; a feeding means for feeding the twin wire; a splitting means provided on a twin wire feeding path to split the twin wire; and a splitting operation controlling means for controlling the start and end of the twin wire splitting operation carried out by the splitting means according to the length of the twin wire feeding path between the bonding position of the wire bonding means and the splitting position of the splitting means, the length of the twin wire to be split, and the feed length of the twin wire for each bonding corresponding to the connecting sequence of positions to be connected by the twin wire on the printed circuit board.

BRIEF DESCRIPTION OF THE DRAWINGS

These and other objects and features of the present invention will become apparent from the following description with reference to the accompanying drawings, in which.

DESCRIPTION OF THE PREFERRED EMBODIMENTS

Figure 1:
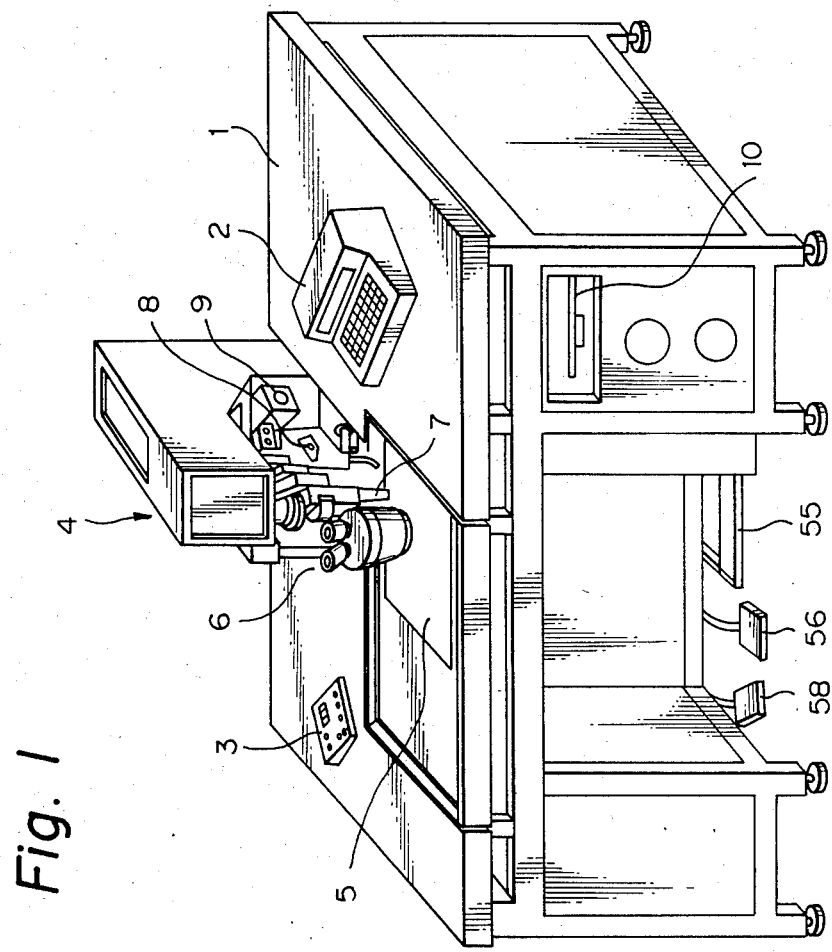
FIG. 1 is a perspective view of a twin wire splitter system according to the present invention.

FIG. 1 is a perspective view of a twin wire splitter system according to the present invention. Provided on a desk 1 are an operator console 2, an auxiliary operation panel 3, and a head 4. An X-Y table 5 is provided under the head 4. The head 4 comprises a microscope 6, a bonding unit 7, a splitter 8, and a bobbin 9 on which the twin wire is wound. FIG. 1 also illustrates a foot pedal 55 for driving the bonding unit 7, a repeat foot switch 56, and a back lead foot switch 57.

Figure 2:
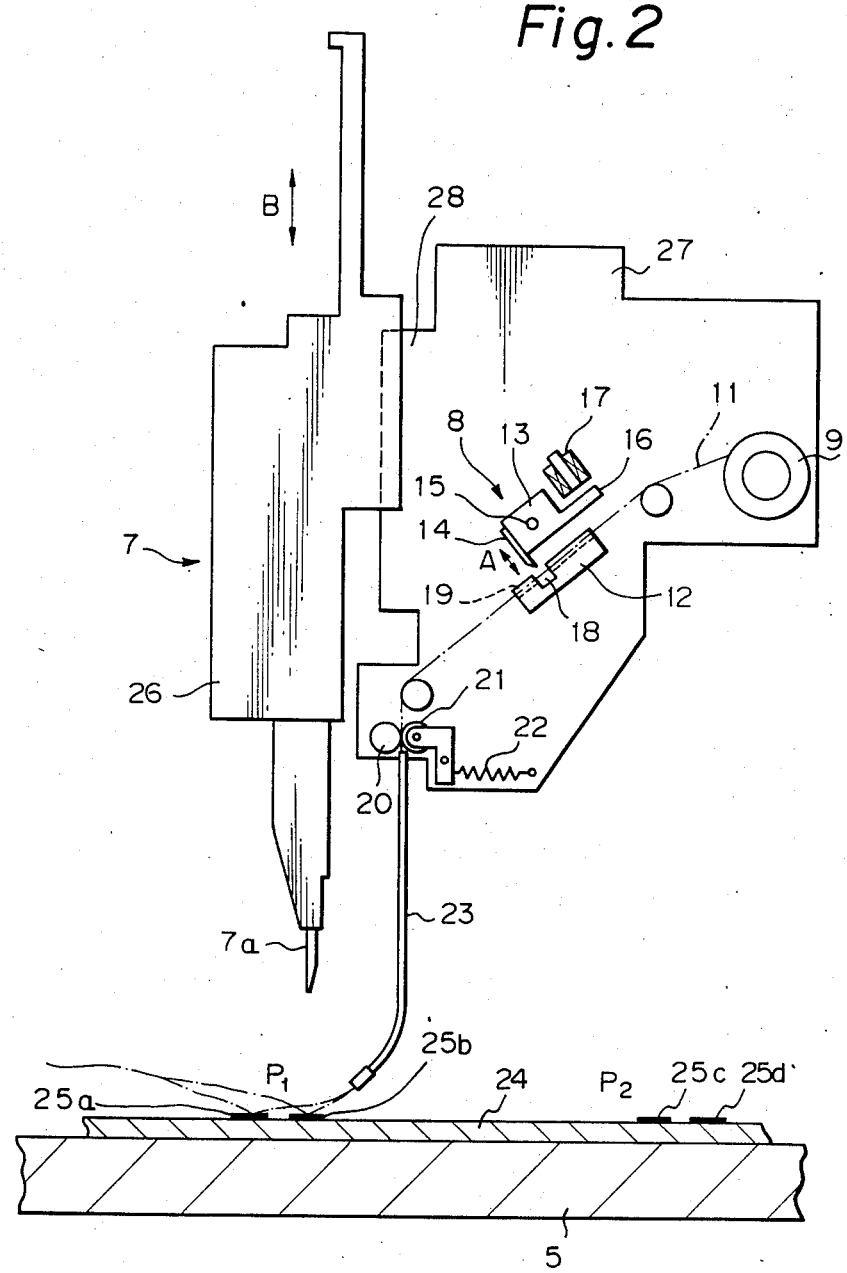
FIG. 2 is a side elevational view of the main part of the twin wire splitter system according to the present invention.

FIG. 2 is a side elevational view of the components forming the main part of the twin wire splitter system of the present invention. A printed circuit board 24 is placed on the X-Y table 5. At wire connecting positions $P_1$ and $P_2$ on the printed circuit board 24, are formed a pair of adjacent pads 25a and 25b and another pair of adjacent pads 25c and 25d, respectively. Of each pair of pads 25a, 25b, and 25c, 25d, one pad is used for the connection of a signal line and is connected to an internal layer pattern of the printed circuit board 24 through a through hole (not shown), and the other pad is used for grounding and is connected through another through hole (not shown) to an earth pattern provided on the internal layer of printed circuit board 24. A twin wire 11 (indicated by a dash-dot line) is split into two wires for a predetermined length and one wire is bonded to each of the pads 25a, 25c and the other wire is bonded to each of the pads 25b, 25d at each of the wire connecting positions $P_1$ and $P_2$. The twin wire is not split at the intermediate portion thereof between the wire connecting positions $P_1$ and $P_2$.

Figure 3:
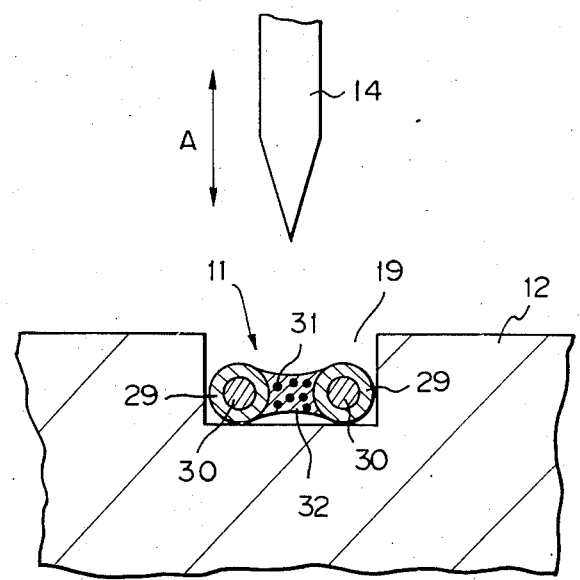
FIG. 3 is a schematic, cross-sectional and fragmentary elevational view of a portion of the twin wire to be split, in operation of the system shown in FIG. 2.

The twin wire 11 is fed from the bobbin 9 affixed to a frame 27 of the system. The frame 27 is provided with the splitter 8. The splitter 8 comprises a guide member 12 having a guide groove 19 for guiding the twin wire 11, and a splitter member 13 having a pin 14 for splitting the twin wire. The twin wire 11 is received in the guide groove 19 of guide member 12, as shown in FIG. 3. As shown in the figure, the twin wire 11 consists of two wires 30 covered with insulation coating material 29, and joined by an intermediate spacing material 31 made of nylon fabrics, etc., which is adhered to the insulation coating material 29 of the wires 30 with adhesive 32 to maintain a predetermined interval between two wires 30. The outer diameter of coating material 29 is usually about 0.1 mm. The splitting pin 14 is thrust into the center of the twin wire 11, the twin wire 11 is then fed along the guide groove 19, and the wires 30 are split apart. The guide member 12 is provided with a recess 18 (or through hole, gap, etc.,) to allow the pin 14 to protrude through the spacing material 31. The split member 13 with the pin 14 fixed thereto is rotatable around a shaft 15, and a solenoid 17 is actuated to attract and release a contact piece 16 so that the pin 14 may be reciprocated as indicated by an arrow A.

A feeding means for feeding the twin wire 11 comprises a feed roller 20 and a pinch roller 21, which is pressed against the roller 20 by a spring 22. The feed roller 20 is connected to a step motor (not shown). The twin wire 11 is held between the rollers 20 and 21 driven by a stepping motor (not shown) and fed thereby to a bonding position through a feeder guide 23.

The bonding unit 7 comprises a main body 26 and a bonding tip 7a attached to the end of main body 26, and is reciprocated along a guide piece 28 of the frame 27 as indicated by an arrow B.

The wire bonding operation performed by the twin wire splitter system having the above construction will be described below. Data of a printed circuit board to be processed is input to the floppy unit 10, and the X-Y table 5 is driven accordingly to bring a wire connecting position of the printed circuit board 24 under the bonding unit 7. An operator, using the microscope 6, brings one of a pair of pads on the connecting location precisely to the bonding position and operates the foot pedal 55 to bond one of split wires to one of the pads and the other split wire to the other pad. After finishing the bonding operation at one wire connecting position, the X-Y table 5 is driven to bring the next wire connecting position under the bonding unit 7 to perform the next wire bonding operation in the same way. In this case, as described later in detail, the twin wire 11 has already been split by the splitter 8 for a predetermined length with an interval of one feed length of the twin wire 11 corresponding to the feed of the X-Y table 5.

Figure 4:
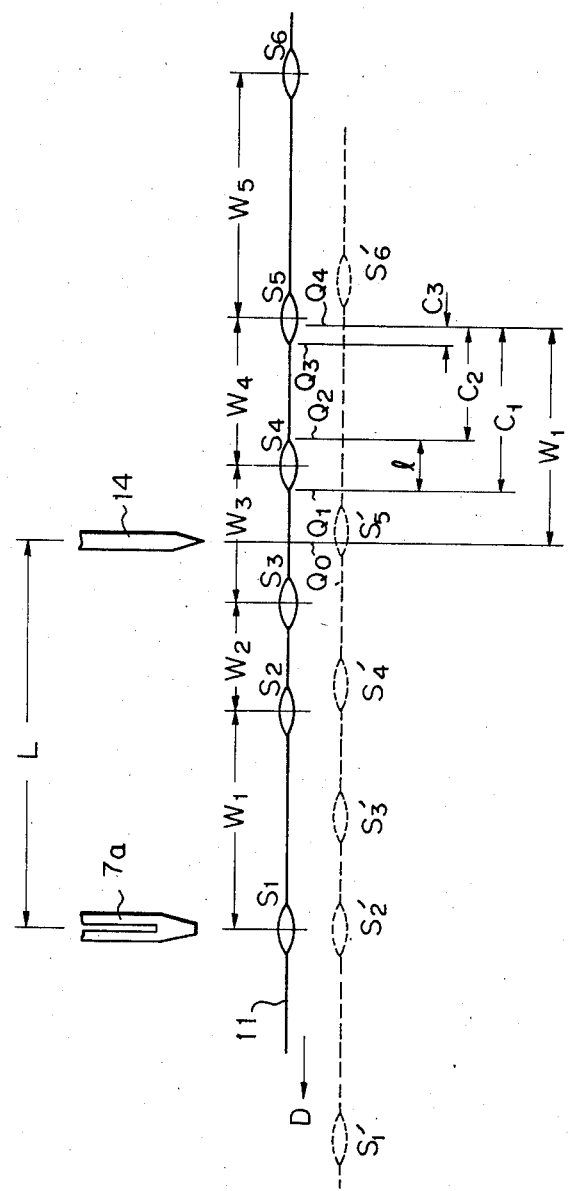
FIG. 4 is a schematic illustration for explaining the operation of the twin wire splitter system according to the present invention.

The splitting operation of the twin wire splitter system according to the present invention will be described with reference to FIG. 4. As an example, suppose the twin wire 11 is provided sequentially with split portions $S_1$ to $S_6$ with respective, sequential spacing intervals $W_1$ to $W_5$. The split length of each of the split portions $S_1$ to $S_6$ is set as "1". A distance (Mechanical Fixed Wire Length; MFWL) along the twin wire feeding path between the bonding position (the position of bonding tip 7a) and the splitting position (the position of pin 14 for splitting) is set as "L". After the completion of the bonding of split portion $S_1$, the twin wire 11 is fed for the feed length $W_1$ in a direction of arrow D, and the next split portion $S_2$ is moved to the bonding position (indicated by a dot line). The split portions $S_1$ to $S_6$ correspondingly are moved to positions $S_1'$ to $S_6'$ as indicated by dotted lines. Data for the positions of the split portions $S_1$ to $S_6$ has been input in advance to a central processing unit, which will be described later. Accordingly, the positions (in this example, $S_4$ and a part of $S_5$) of the twin wire 11 to be split by the pin 14 while the twin wire 11 is fed by the distance $W_1$ after the completion of the bonding of split portion $S_1$, is decided by the central processing unit. Namely, the positions of the split starting point $Q_1$ and the split ending point $Q_2$ of the split portion $S_4$, and the position of the split starting point $Q_3$ of the split portion $S_5$ are calculated according to the feed length $W_1$ for which the twin wire 11 is fed under the position of pin 14 (the splitting position). When the points $Q_1$ and $Q_3$ reach the splitting position respectively, the pin 14 is driven to be lowered to carry out the splitting operation, and to be raised when the point $Q_2$ reaches the splitting position to end the splitting operation. When the point $Q_4$ reaches the splitting position, the feed operation is stopped and the split portion $S_2'$ is bonded at the bonding position.

The positions of points $Q_1$ to $Q_3$ are decided by counting the number of pulses of the stepping motor. An example of calculation to decide the positions of points $Q_1$ to $Q_3$ according to the remaining number of counts with respect to the number of all counts for the feed length $W_1$ is as follows:

A calculation value $C_1$ corresponding to the number of remaining counts, which decides the split start point $Q_1$ of the split portion $S_4$, is calculated as follows:

$$C_1 = (L + W_1) - (W_1 + W_2 + W_3) + \tfrac{1}{2}l$$

Similarly, a calculation value $C_2$ of the split end point $Q_2$ of the split portion $S_4$ is given as follows:

$$C_2 = (L + W_1) - (W_1 + W_2 + W_3) - \tfrac{1}{2}l$$

A calculation value $C_3$ of the split start point $Q_3$ of the split portion $S_5$ is given as follows:

$$C_3 = (L + W_1) - (W_1 + W_2 + W_3 + W_4) + \tfrac{1}{2}l$$

Accordingly, during the feed of the twin wire 11 for the feed length $W_1$, a counter circuit counts the number of remaining steps of the step motor so that the pin 14 will be raised or lowered at each of the remaining values $C_1$, $C_2$, and $C_3$ to split the twin wire 11 at predetermined positions for a predetermined length. In this calculation, the split portions $S_2$ and $S_3$ and the end point of the split portion $S_5$ are not included in the range of the feed length $W_1$. The split portions $S_2$ and $S_3$ have already been split during the previous feed motion. The remaining part of the split portion $S_5$ will be split during the next feed motion (feed motion from $S_2$ to $S_3$).

Figure 5A:
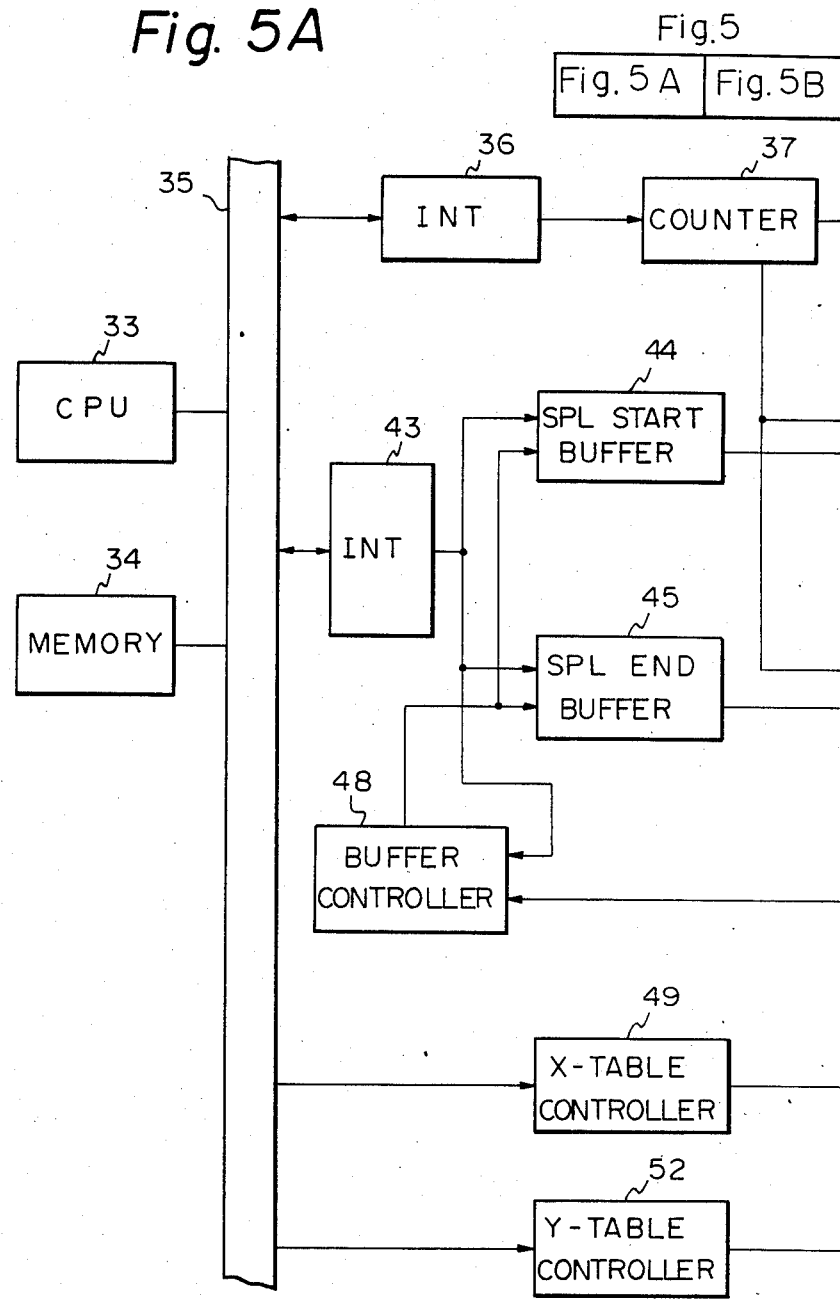
FIG. 5a and 5b are block diagrams of a control circuit for operating the twin wire splitter system according to the present invention.
Figure 5B:
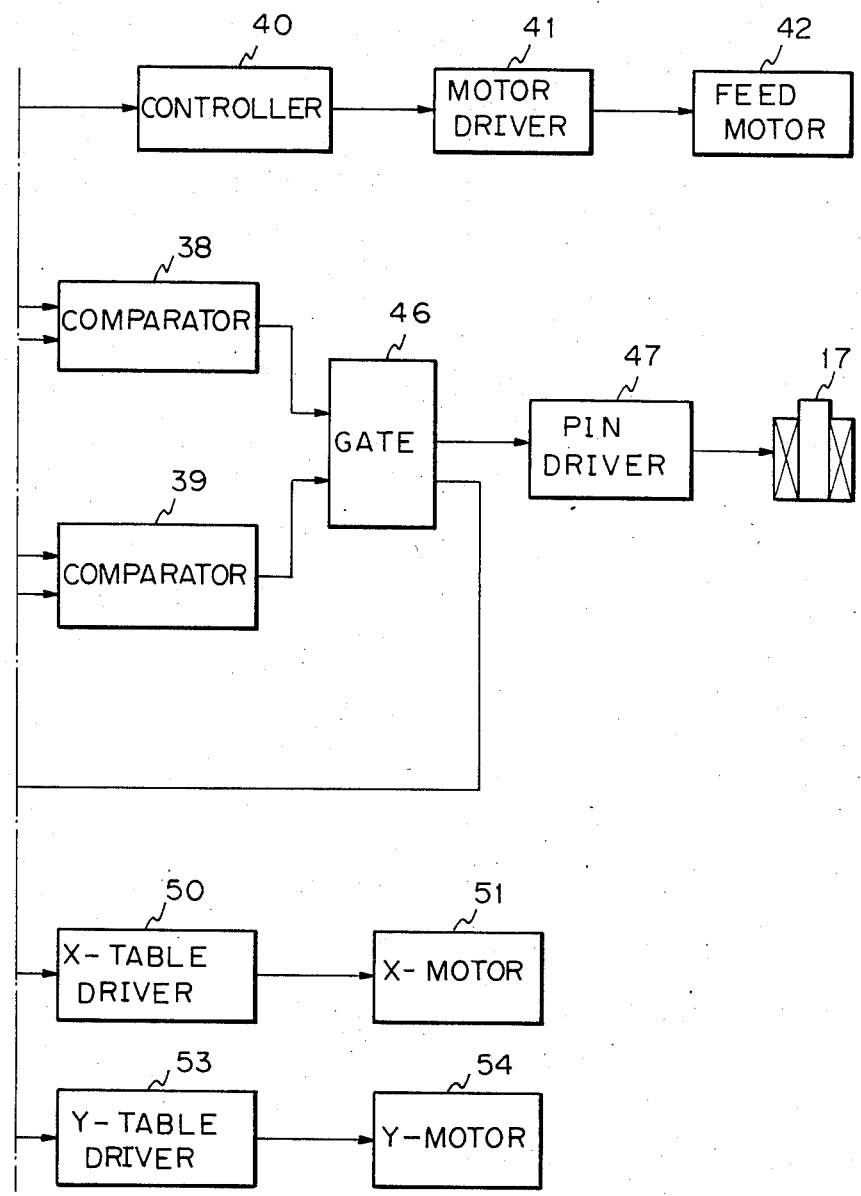

FIG. 5 shows an example of a circuit for controlling the operation for splitting the twin wire 11. A central processing unit (CPU) 33 comprising a microprocessor calculates the number of counts corresponding to the driving points i.e., the points in time at which the pin 14 is driven into the wire for splitting it at the beginning of a split portion and thereafter pulled out of the wire at the end of the split portion of the split pin 14 in one feeding operation. A memory circuit 34 stores data such as the length L of MFWL, split length l, and split intervals $W_1$ to $W_5$ corresponding to the movements of printed circuit board 24. The CPU performs the calculation based on the data stored in the memory circuit 34.

The result of the calculation is input to a split start buffer circuit 44 and a split end buffer circuit 45 through an interface 43. The split start point data is held in the split ("SPL") start buffer circuit 44, and the split end point data is held in the split ("SPL") end buffer circuit 45. Through an interface ("INT") 36 the CPU 33 drives a motor controller circuit 40 and a remaining amount counter 37 to operate a motor driver circuit 41 so that a stepping feed motor 42 is rotated to turn the feed roller 20 (FIG. 2). During this operation, the counter 37 counts the remaining steps of the stepping motor 42 to judge the length of the twin wire 11 fed by the step motor 42. A value counted by the counter 37 and the data held in the split start buffer circuit 44 are compared in a comparator circuit 38. If they coincide, a gate circuit 46 is opened to actuate a pin driver circuit 47 to magnetize the solenoid 17 so that the pin 14 (FIG. 2) will be thrust into the twin wire 11, which is then split. The stepping motor 42 is rotated further, and, when another comparator circuit 39 judges that the remaining count value coincides with the split end point data, the gate circuit 46 is closed to stop the operation of the pin driver circuit 47. As a result, magnetization of solenoid 17 is released to raise the pin 14 and finish the operation of splitting the twin wire 11. This drive control of the pin driver circuit 47 is performed by a buffer controller circuit 48 according to whether the gate circuit 46 is opened or closed, and the result of the calculation carried out by the CPU 33.

The CPU 33 also moves the X-Y table 5 (FIG. 2) according to the data for the wire connecting positions and the connecting sequence of the printed circuit board 24. Namely, an X-table driver unit 50 is driven through an X-table controller circuit 49 to rotate an X-motor 51 for a required amount. Similarly, a Y-table driver unit 53 is driven through a Y-table controller circuit 52 to rotate a Y-motor 54 for a required amount.

The delivery of the control signals from the CPU 33 is carried out via a common bus 35.

As described above, the present invention achieves the formation of split portions in a twin wire at any interval during one feed operation of the twin wire, so that the twin wire splitting operation may be fully automated and thus improve the efficiency of a wire bonding operation.

I claim:

1. A twin wire splitter system comprising:
   an X-Y table for mounting a printed circuit board thereon;
   wire bonding means for continuously bonding a twin wire to a plurality of wire connecting positions on said printed circuit board;
   means defining a twin wire feeding path;
   feeding means for feeding the twin wire along said twin wire feeding path;
   splitting means for selectively splitting the twin wire at predetermined, relatively displaced splitting positions therein;
   said wire splitting means and said wire bonding means being disposed at corresponding splitting and bonding postions of said twin wire feeding path displaced by a first predetermined distance;
   a splitting operation controlling means for controlling the start and the end of each twin wire splitting operation carried out by said splitting means as a function of said first predetermined distance along said twin wire feeding path between said bonding position of said wire bonding means and said splitting position of said splitting means, the split length of one split portion of the twin wire, and the length of said twin wire to be fed for each successive bonding operation corresponding to a sequence of positions to be interconnected by said twin wire on said printed circuit board;
   said feeding means comprising a stepping motor and a counter circuit connected to said splitting operation controlling means to detect the length of the twin wire which is fed and for driving said stepping motor in accordance with successive pulses; and
   said splitting operation controlling means comprises:
   a central processing unit for calculating the start and end points of each split portion in the twin wire, required for and associated with each feed of the twin wire;
   a split start buffer circuit and a split end buffer circuit for storing results of the start and end point calculations performed by said central processing unit;
   a split start point comparator circuit and a split end point comparator circuit for comparing outputs of the respective said buffer circuits with an output of said counter circuit and producing respectively corresponding outputs;
   a gate circuit for driving said splitting means according to the outputs of said comparator circuits; and
   said central processing unit calculating the total number of pulses required for feeding the twin wire by each successive feed length by said stepping motor and calculating each of said start and end points and representing same by the number of pulses required for feeding the remaining length of the twin wire required to be fed, from each of the start and end points to the end of the feed length, by the stepping motor.

2. A twin wire splitter system according to claim 1, wherein said splitting means comprises a guide member having a guide groove for guiding said twin wire, and a pin for thrusting through said twin wire which is guided to a predetermined position by said guide member and for splitting said twin wire by virtue of the feed of said twin wire, said pin being driven by an electromagnet.

3. A twin wire splitter system according to claim 1, wherein said feeding means comprises a driving roller connected to a driving motor and a pinch roller pressed against said driving roller by a spring, said feeding means holding said twin wire between said rollers to feed said twin wire.

4. A twin wire splitter system according to any one of claims 1 to 3, wherein said twin wire is continuously fed through said feeding means.

5. A twin wire splitter system according to any one of claim 1 to 3, wherein a pair of adjacent pads, one of which is used for connecting a signal line and the other of which is used for connecting grounding are formed at each wire connecting position of said printed circuit board, each of said pads being bonded to each of said split twin wires.

* * * * *

UNITED STATES PATENT AND TRADEMARK OFFICE
CERTIFICATE OF CORRECTION

PATENT NO. : 4,691,855

DATED : SEPTEMBER 8, 1987

INVENTOR(S) : HARUMI YAGI

It is certified that error appears in the above-identified patent and that said Letters Patent is hereby corrected as shown below:

Col. 3, line 59, "1" should be --$\ell$--.

Col. 4, line 32, "+1/21" should be --+1/2$\ell$--;
   line 37, "-1/21" should be ---1/2$\ell$--;
   line 42, "+1/21" should be --+1/2$\ell$--;
   line 65, "1," should be --$\ell$,--.

Signed and Sealed this

Second Day of February, 1988

Attest:

DONALD J. QUIGG

Attesting Officer     Commissioner of Patents and Trademarks